(12) United States Patent
France et al.

(10) Patent No.: US 9,826,666 B2
(45) Date of Patent: Nov. 21, 2017

(54) SYSTEM FOR COOLING HYBRID VEHICLE ELECTRONICS, METHOD FOR COOLING HYBRID VEHICLE ELECTRONICS

(71) Applicants: David M. France, Lombard, IL (US); Wenhua Yu, Darien, IL (US); Dileep Singh, Naperville, IL (US); Weihuan Zhao, Woodridge, IL (US)

(72) Inventors: David M. France, Lombard, IL (US); Wenhua Yu, Darien, IL (US); Dileep Singh, Naperville, IL (US); Weihuan Zhao, Woodridge, IL (US)

(73) Assignee: UCHICAGO ARGONNE, LLC, Chicago, IL (US)

( * ) Notice: Subject to any disclaimer, the term of this patent is extended or adjusted under 35 U.S.C. 154(b) by 273 days.

(21) Appl. No.: 14/596,415

(22) Filed: Jan. 14, 2015

(65) Prior Publication Data

US 2016/0200165 A1  Jul. 14, 2016

(51) Int. Cl.
  *B60K 11/00* (2006.01)
  *H05K 7/20* (2006.01)
  (Continued)

(52) U.S. Cl.
  CPC ......... *H05K 7/20945* (2013.01); *H01L 23/36* (2013.01); *H01L 23/427* (2013.01);
  (Continued)

(58) Field of Classification Search
  CPC .......................................... B60K 11/00–11/04
  See application file for complete search history.

(56) References Cited

U.S. PATENT DOCUMENTS 4,047,561 A  9/1977 Jaster et al.
6,498,725 B2  12/2002 Cole et al.
(Continued)

OTHER PUBLICATIONS

El-Genk et al., Efficient Spreaders for Cooling High-Power Computer Chips, Applied Thermal Engineering, 27, 2007, 1072-1088, elsevier.
(Continued)

*Primary Examiner* — John Walters
*Assistant Examiner* — James Triggs
(74) *Attorney, Agent, or Firm* — Cherskov Flaynik & Gurda, LLC (57) ABSTRACT

The invention provides a single radiator cooling system for use in hybrid electric vehicles, the system comprising a surface in thermal communication with electronics, and subcooled boiling fluid contacting the surface. The invention also provides a single radiator method for simultaneously cooling electronics and an internal combustion engine in a hybrid electric vehicle, the method comprising separating a coolant fluid into a first portion and a second portion; directing the first portion to the electronics and the second portion to the internal combustion engine for a time sufficient to maintain the temperature of the electronics at or below 175° C.; combining the first and second portion to reestablish the coolant fluid; and treating the reestablished coolant fluid to the single radiator for a time sufficient to decrease the temperature of the reestablished coolant fluid to the temperature it had before separation.

10 Claims, 8 Drawing Sheets

(51) Int. Cl.
*H01L 23/36* (2006.01)
*H01L 23/427* (2006.01)
*H01L 23/473* (2006.01)
*F01P 3/00* (2006.01)

(52) U.S. Cl.
CPC ....... *H01L 23/473* (2013.01); *H05K 7/20936* (2013.01); *F01P 2003/008* (2013.01); *F01P 2050/24* (2013.01)

(56) References Cited

U.S. PATENT DOCUMENTS

| | | |
|---|---|---|
| 8,061,414 B2 | 11/2011 | Suzuki et al. |
| 2011/0296855 A1* | 12/2011 | Johnston ............... B60L 3/0046 62/79 |

OTHER PUBLICATIONS

Ramstorfer et al., Subcooled Boiling Flow Heat Transfer from Plain and Enhanced Surfaces in Automotive Applications, Journal of Heat Transfer, vol. 130, Jan. 2008, 011501-1 to 011501-9, ASME.

Rau et al., Local Two-Phase Heat Transfer From Arrays of Confined and Submerged Impinging Jets, International Journal of Heat and Mass Transfer, 67, 2013, 487-498, elsevier.

Bennion et al., Rapid Modeling of Power Electronics Thermal Management Technologies, Conference Paper NREL/CP-540-4612, Aug. 2009, National Renewable Energy Laboratory, published in Dearborn, Michigan.

Kandlikar et al., An Experimental Investigation on Flow Boiling of Ethylene-Glycol/Water Mixtures, vol. 125, Apr. 2003, 317-325, ASME.

Mudawar et al., Two-Phase Spray Cooling of Hybrid Vehicle Electronics, Conference Paper NREL/CP-540-42389, Jul. 2008, National Renewable Energy Laboratory, published in Orlando Florida.

National Renewable Energy Laboratory, NREL Helps Cool the Power Electronics in Electric Vehicles, Jul. 2011, published in Golden Colorado.

Warrier, Heat Transfer and Pressure Drop in Narrow Rectangular Channels, Experimental Thermal and Fluid Science, 26, 2002, 53-64, elsevier.

Bharathan et al., Advanced Power Electronics-Thermal Management, undated, National Renewable Energy, Golden Colorado.

Yu et al., Coolant Boiling for Thermal Control of Hybrid Electric Vehicle Power Electronics, Apr. 2014, Argonne National Laboratory, Lemont Illinois.

Shah, A General Correlation for Heat Transfer During Subcooled Boiling in Pipes and Annuli, ASHRAE Journal—American Society of Heating Refrigerating and Air-Conditioning Engineers, vol. 18, Issue 12, pp. 41-42, Jan. 1, 1976, Amer Soc Heat Refrig Air-Conditioning Eng inc.

* cited by examiner

SYSTEM FOR COOLING HYBRID VEHICLE ELECTRONICS, METHOD FOR COOLING HYBRID VEHICLE ELECTRONICS

CONTRACTUAL ORIGIN OF THE INVENTION

The U.S. Government has rights in this invention pursuant to Contract No. DE-AC02-06CH11357 between the U.S. Department of Energy and UChicago Argonne, LLC, representing Argonne National Laboratory.

BACKGROUND OF THE INVENTION

1. Field of the Invention

This invention relates to a system for cooling electronics, and more specifically this invention relates to a compact system and method for cooling hybrid vehicle electronics using only one radiator.

2. Background of the Invention

Hybrid vehicle electronics have become more sophisticated. As a result, the use of wide-bandgap semiconductors will increase. Wide-bandgap semiconductors permit devices to operate at much higher voltages, frequencies and temperatures than conventional semiconductor materials. This allows for more powerful electrical mechanisms to be built which are cheaper and more energy efficient.

"Wide-bandgap" refers to higher voltage electronic band gaps significantly larger than one electron volt (eV). The exact threshold of "wideness" often depends on the context, but for common usage, "wide" bandgap typically refers to material with a band gap of at least 3 eV, significantly greater than that of the commonly used semiconductors, silicon (1.1 eV) or gallium arsenide (1.4 eV).

Wide-bandgap materials are often utilized in applications in which high-temperature operation is important. The higher energy gap gives the devices the ability to operate at higher temperatures. However, a junction temperature of between 150° C. and 175° C. should be maintained under the semiconductors to prevent electronics malfunction. This cannot be accomplished with 105° C. coolant used in standard radiators.

Automotive examples of wide-bandgap devices include traction drive components, battery chargers (for plug in hybrid electric vehicles, PHEVs), boost converters (for stepping up battery voltages higher than the battery capacities), inverters (for converting DC to AC for phased power to traction motors and generators), and bi-directional DC-DC converters (to shuttle power among buses to operate lighting, brake assist, power steering, etc.).

State of the art power electronic semiconductors in hybrid vehicles attempt to address high temperatures using multiple heat exchangers or radiators. Typical heat sink configurations consist of multiple layers of materials, starting with the semiconductors, followed by a copper thermal spreader, one or more layers of a thermal interface material (TIM), and flow channels for the liquid coolant.

Figure 1:
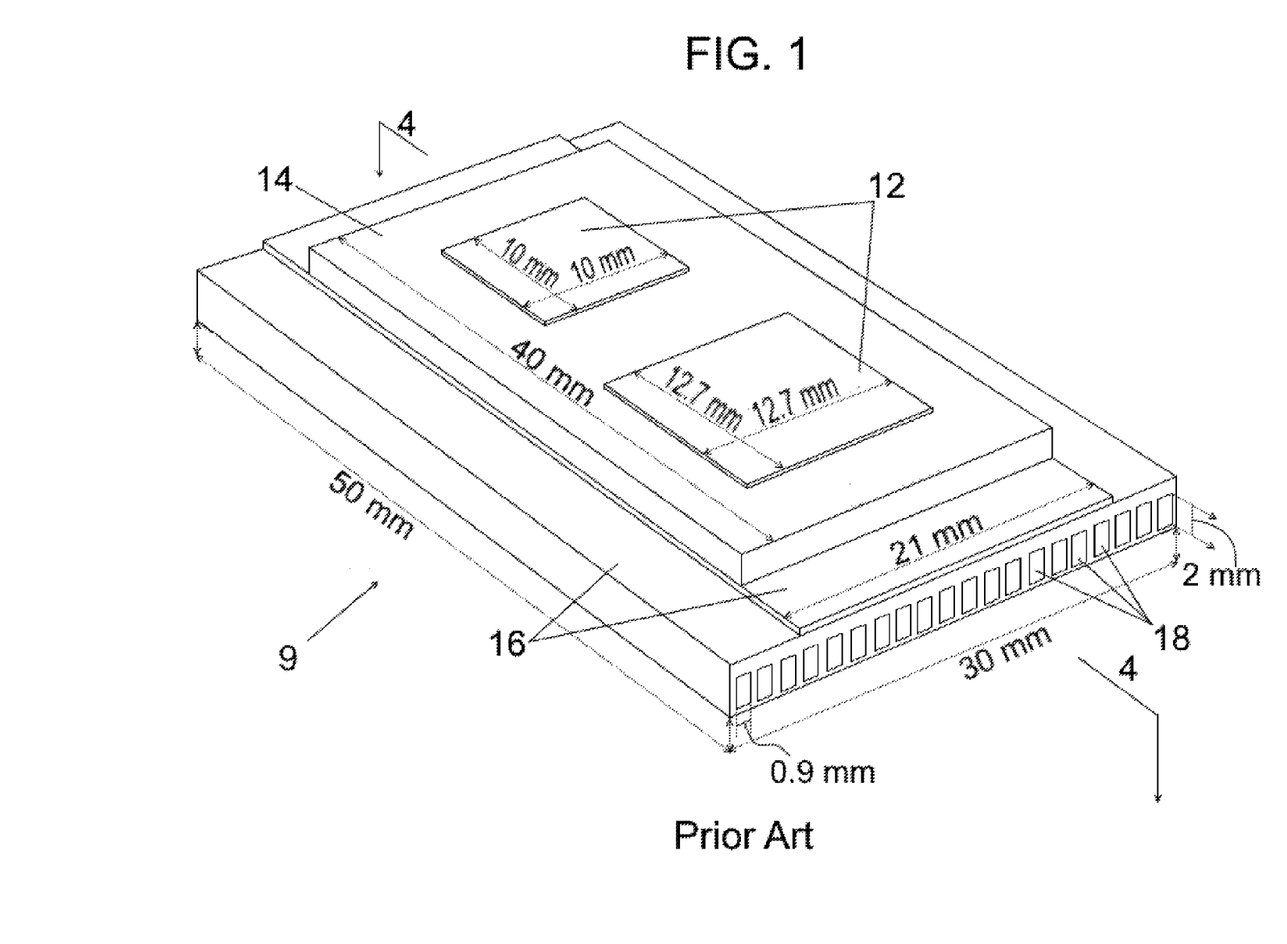
FIG. 1 is a perspective view of a prior art electronics cooling configuration.

FIG. 1 is a perspective view of a prior art cooling configuration, that configuration designated as numeral 9. One or a plurality of semiconductors 12 are supported on a thermal spreading substrate 14. The thermal spreading substrate 14 is supported by one or a plurality of TIM 16. This TIM 16 is in physical contact with flow channels 18 adapted to receive coolant fluids.

Each of the layers below the semiconductors of FIG. 1 has a resistance to heat transfer. The largest of these resistances are the TIMs 16 and the coolant fluid. Coolant fluids exhibit high resistance to heat transfer due to their laminar flow characteristics. Such poor laminar flow heat transfer rates require that a second radiator (using 75° C. coolant) be used in hybrid electric vehicles to cool the power electronics. As such, state of the art hybrid vehicle cooling systems utilize two separate radiators, one for the internal combustion engine, and a second one for the electronics. This second radiator and associated plumping adds cost and weight to the vehicle while reducing available space for other components.

A need exists in the art for an electronics cooling system and method that does not employ multiple radiators. The system and method should eliminate or substantially reduce the thermal resistance now plaguing state of the art coolant-side fluid dynamics, such that the system and method eliminates the potential of a TIM reaching a CHF condition. The system and method should maintain the electronics side at no more than approximately 175° C., given power production rates of state of the art chips of about 100 W/cm$^2$, while minimizing pumping power requirements.

SUMMARY OF INVENTION

An object of the invention is to provide an electronics cooling system that overcomes many of the disadvantages of the prior art.

Another object of the invention is to provide a system and method for cooling hybrid vehicle electronics. A feature of the invention is that only one radiator is required to cool both the internal combustion engine and the electronics of the vehicle. Another feature of the invention is that the invention can be configured to cool a single surface, or a plurality of surfaces of the electronics components. An advantage of the invention is that it confers lighter weight and increased compactness.

Still another object of the present invention is to provide a compact system for cooling hybrid vehicle electronics. A feature of the invention is that it uses most of the same components of typical cooling systems. An advantage of the invention is that it provides increased cooling rates at low pumping power, therefore leading to reduced costs and weight.

Yet another object of the present invention is to provide a method for cooling wide-bandgap semiconductor electronics. A feature of the invention is that it eliminates the need for cooling fins, otherwise in thermal communication with the electronics and foundation plates. An advantage of the present invention is its ability to accommodate power densities of at least about 100 W/cm$^2$ without cooling fins and as high as about 250 W/cm$^2$ with fins (multiple-sided cooling), therefore finding applicability to new hybrid electric vehicles with, and without, wide-band semiconductors.

Another object of the present invention is to provide approximately a 25 percent more efficient method and system for cooling high power electronics. For example, the present invention can optimize a current, one-sided, cooling system from a typical 100 W/cm$^2$ power density to 125. A feature of the invention is the use of traditional vehicle coolants that are subcooled, such that the coolants remain as substantially a single phase throughout the cooling cycle. An advantage of the invented boiling coolant method and system is its superior heat removal capacity compared to traditional laminar fluid flow convective heat transfer systems, such that the invented system facilitates more efficient cooling of high power density electronics.

Still another object of the present invention is to provide a single radiator system that combines internal combustion engine cooling and power electronics cooling operations, whereby the system can maintain 250 W/cm² density electronics at or below 175° C. A feature of the invention is that a plurality of typical electronic heat sink surfaces (e.g. two sides of a semiconductor chip) are contacted with pressurized typical engine coolant. An advantage of the invention is that the pressurized fluid provides an adequate subcooling temperature range for keeping junction temperatures of advanced power electronics within operating limits. The system is passive in that it does not require cooling jets, nozzles, gas separators or other moving means for cooling heated surfaces via atomization (e.g. spray cooling), forced convection (e.g. pressurized), or other mechanical means of mass flow of a fluid such as liquid coolant or gas such as air or refrigerant. Rather, the engine coolant's resistance to heat transfer is substantially decreased by the subcooled boiling. As such, an embodiment of the invention is nozzle-less.

Briefly, the invention provides a single radiator cooling system for use in hybrid electric vehicles, the system comprising a surface in thermal communication with electronics, and subcooled boiling fluid contacting the surface.

The invention also provides a single radiator method for simultaneously cooling electronics and an internal combustion engine in a hybrid electric vehicle, the method comprising separating a coolant fluid into a first portion and a second portion; directing the first portion to the electronics and the second portion to the internal combustion engine for a time sufficient to maintain the temperature of the electronics at or below 175° C.; combining the first and second portion to reestablish the coolant fluid; and treating the reestablished coolant fluid to the single radiator for a time sufficient to decrease the temperature of the reestablished coolant fluid to maintain steady state cooling in both portions. In an embodiment of the method, the coolant is maintained throughout the process at a temperature below its boiling point and the reestablished coolant has approximately the same temperature entering the radiator as in a conventional single-phase cooling loop.

BRIEF DESCRIPTION OF DRAWING

The invention together with the above and other objects and advantages will be best understood from the following detailed description of the preferred embodiment of the invention shown in the accompanying drawings, wherein.

DETAILED DESCRIPTION OF THE INVENTION

The foregoing summary, as well as the following detailed description of certain embodiments of the present invention, will be better understood when read in conjunction with the appended drawings.

As used herein, an element or step recited in the singular and preceded with the word "a" or "an" should be understood as not excluding plural said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

The invented subcooled boiling electronics cooling-system and method utilizes subcooled (e.g. compressed) boiling or low vapor quality saturation boiling of cooling fluids to enhance cooling of power electronics. A salient feature of the invention is a controlled use of boiling of coolant fluid to increase the accuracy in thermal management of these electronics. As such, the invention utilizes non-laminar coolant flow heat transfer paradigms to provide superior heat sink characteristics.

A myriad of fluids are suitable for use in the invented system, including, but not limited to glycol based liquids (e.g. ethylene glycol, polyethylene glycol, propylene glycol, water, polyalphaolefin (PAO), and combinations thereof. The venue of the semiconductors to be cooled will determine the fluid utilized. For example, in automotive applications, the semiconductors used in hybrid electronics should be maintained at or below 175° C. In such automotive applications, water and its mixtures containing ethylene glycol (0 to 60 percent mass fraction, limited by this maximum allowable temperature) is a suitable coolant.

Figure 7:
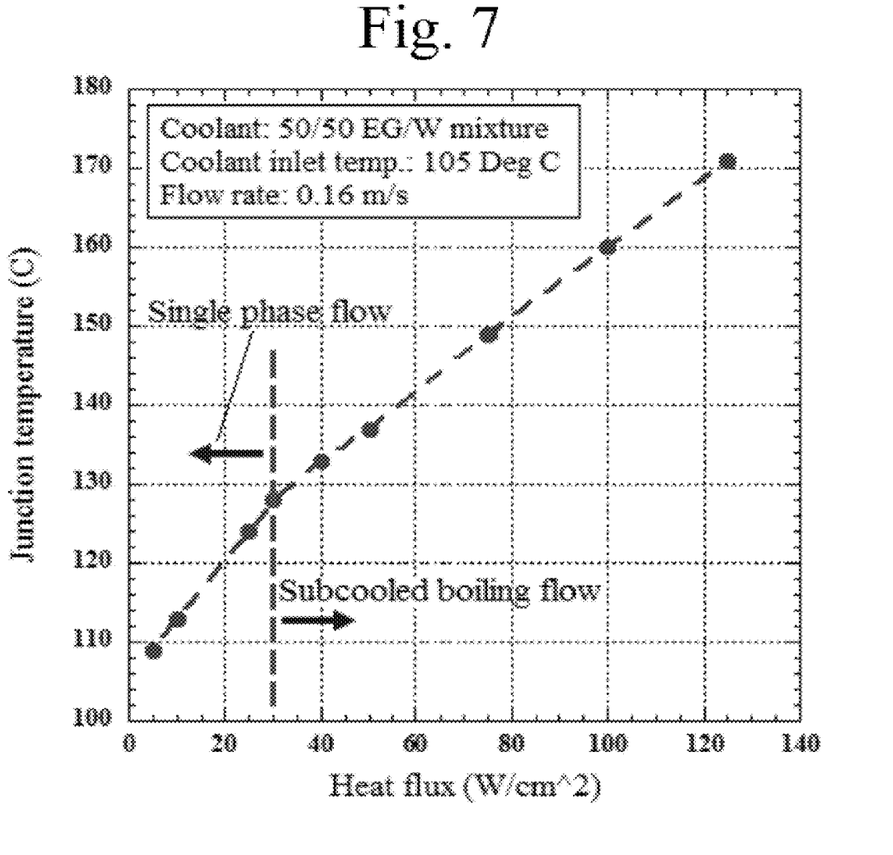
FIG. 7 is a graph depicting junction temperature as a function of heat flux, in accordance with features of the present invention.

An embodiment of the invention is applicable using components already found in hybrid electric vehicles. The invention requires only one radiator and coolant pumping system while maintaining no more than 175° C. semiconductor temperatures. There are several ways to do this:

1. If costly fins are not utilized as the coolant passages in the power electronics, current heat loads of 100 W/cm² are removed with the use of double-sided cooling.
2. If typical heat sink topographies are utilized (e.g., fins are utilized), 125 W/cm² can be removed with single-sided cooling. This allows for approximately a 25 percent increase in semiconductor size (power output).
3. If fins and double-sided cooling are utilized, approximately 250 W/cm² (i.e., the power load of wide-band semiconductors) can be removed. Alternatively, fins used with double-sided cooling configurations can cool electronics substantially below 175° C. when less than 250 W/cm² densities exist. FIG. 7, discussed further infra, provides cooling data for single sided cooling with fins. As such, when double sided, fin cooling is utilized, the heat flux values are doubled for a given junction temperature.

Given the above configurations, the invention is particularly advantageous in attaining desired cooling ranges utilizing already existing technology in vehicles. No other components than those found in existing hybrid vehicles are required. For example, the microstructure of the TIMs utilized in the invention are unadulterated (uncoated, substantially conformal and nonporous) in that they define typical morphologies. As such, the TIMs lack any special surface finishes, coatings (such as microporous coatings) or generally enhanced porosities or surface area enhancing topographies other than those that are generated during typical production of TIM substrates.

An embodiment of the invention is that it can utilize subcooled boiling alone, i.e. without bulk boiling and without net vapor generation. With subcooled boiling, any vapor generated at the hot surfaces of the coolant channels collapses in the cooler fluid in the center of the channels and leaves the power electronics bathed in liquid phase coolant exclusively. Therefore, the only place boiling occurs is at the interface of the heatsink of power electronics. The remainder of the coolant system operates with liquid coolant.

Alternatively, the invention is operational with some net vapor leaving the heatsink surfaces, where it initially forms. The leaving vapor then combines with cooler liquid recirculating back from the engine such that the resulting reestablished coolant is solely liquid phase once again. Therefore, the invention can operate with bulk boiling in the power electronics if substantially the entire volume of vapor generated is empirically determined to completely change phase back to liquid when combined with the engine coolant. Subcooled boiling case minimizes the portion of the cooling system in which boiling occurs.

Another cooling scenario enabled by the instant method is the utilization primarily of bulk boiling. When bulk boiling occurs at the exit of the power electronics package, subcooled boiling could precede it upstream in the package or it could be mostly or all bulk boiling. In any case when bulk boiling occurs at the exit, the coolant is at its boiling temperature with some vapor mixed with liquid.

When the temperature difference between the thermal transfer surface and the coolant saturation $T_{sat}$ is greater than approximately 4° C. (7.2° F.) to 10° C. (18° F.), isolated bubbles form at nucleation sites and separate from the surface. This separation induces considerable fluid mixing near the surface, thereby providing an automatic means for substantially increasing the convective heat transfer coefficient and the heat flux. The coolant is boiling at the surface (surface temp>$T_{sat}$) while the coolant bulk temperature is below its saturation point. So, the system is in subcooled boiling with the heat transfer advantages. Therefore, in an embodiment of the invention, single phase convection is not the means for transferring heat from electronics surfaces. In another embodiment of the invention, single-phase convection plays a role in heat transfer.

In an embodiment of the invention, traditional vehicle engine coolants are utilized, such as 50/50 ethylene glycol/water mixtures, at pressures between about 0 psig and about 45 psig (gauge pressure, i.e., above atmospheric pressure). Other coolants are also suitable, such as water, propylene glycol, and combinations thereof. The coolant system defines a closed system, whereby coolant is only added to the system if there is a leak or loss. The system is adaptable to a myriad of different cooling paradigms, such that spent or unwanted coolant maybe drained from the system, and replaced with fresh coolant or different coolant. The radiator often serves as the coolant reservoir. As such, draining and filling are often done through a valve at the bottom of the radiator and the cap on top of the radiator, respectively.

Figure 2:
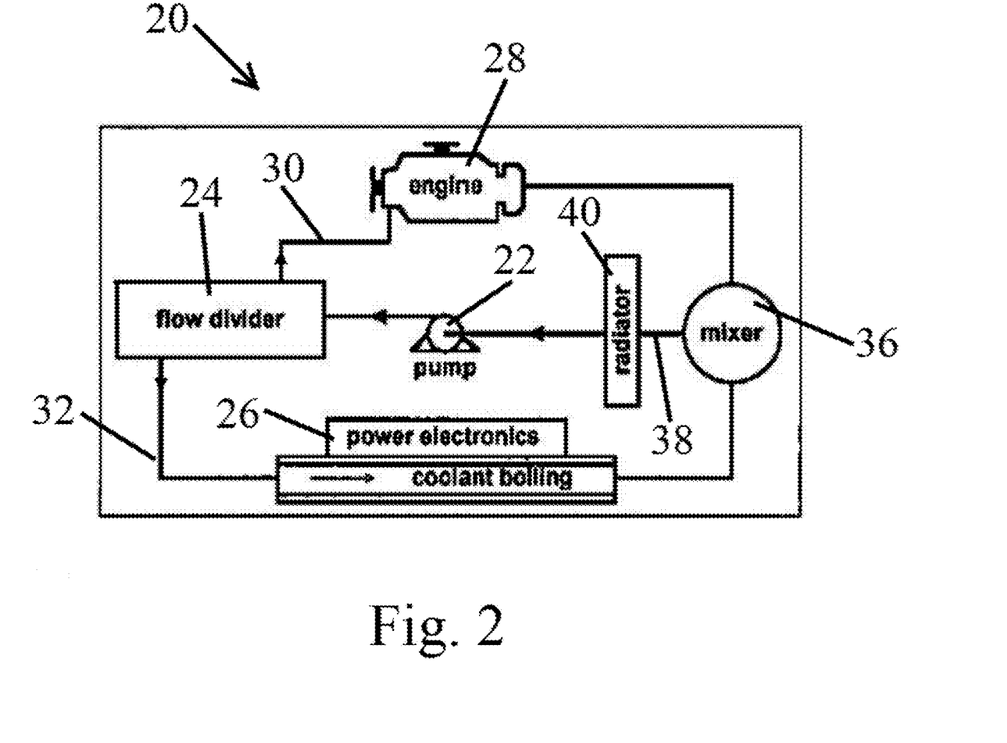
FIG. 2 is a schematic view of a subcooled boiling cooling system, in accordance with features of the present invention.

An embodiment of the invention is the closed system shown schematically as numeral 20 in FIG. 2. Coolant is pumped, pressurized, and otherwise manipulated by a pump 22 in the closed system. Coolant pressures in automobiles are usually limited to about 15 psig, with truck pressures higher than automobiles (e.g., about 30 to about 45 psig). Generally, pressures are substantially constant throughout the system but may be highest by a few psig at the outlet of the pump, and lowest at the inlet of the pump. The maximum pressure is limited by pressure relief valves in the coolant system.

Upon treatment with the pump 22, the fluid contacts a flow divider 24 situated downstream from the pump 22. The flow divider 24 is situated between the power electronics 26 and the regular internal combustion engine 28 of the vehicle.

The flow divider 24 separates the coolant fluid into two portions which may or may not be equal in volume. The relative sizes of the portions will depend on the size of the combustion engine and the electronics bay requiring cooling. In one embodiment, the divider 24 separates the coolant fluid volume into approximately two equal portions. A first portion follows a typical combustion engine cooling route 30. A second portion 32 is directed to the cold plate of the power electronics, the cold plate 16 depicted in FIG. 1 defining the fluid channels 18. It should be noted that while a typical cold plate is integrally molded with (so as to be in thermal contact with) fins defining the fluid channels 18, an embodiment of the invention eliminates the need for fins, given the extremely efficient heat transfer characteristics of the invented subcooled boiling paradigm. As such, electronic bays with smooth (e.g. fin-less) heat transfer surfaces in contact with coolant fluid are adequately cooled with the invented system.

Inasmuch as the cold plate is in thermal communication with the electronics, the coolant in contact with the cold plate 16 absorbs heat from the power electronics, at the maximum heat flux, predominately through subcooled boiling or low vapor quality saturation boiling. The coolant channels may have some single-phase heat transfer at the entrance even at the maximum heat rates. When the vehicle is operating at less than the maximum heat rate, there will be more, or all, single-phase heat transfer.

Downstream from the combustion engine 28 and the power electronics 26, the two fluid portions recombine via a mixer 36 to form a uniform temperature fluid 38. The uniform temperature fluid 38 is then directed, still under pressure, to a vehicle radiator 40 where heat exchangers there cool the fluid. Upon exiting the radiator 40, the coolant returns to the pump 22 to complete the loop.

Figure 3:
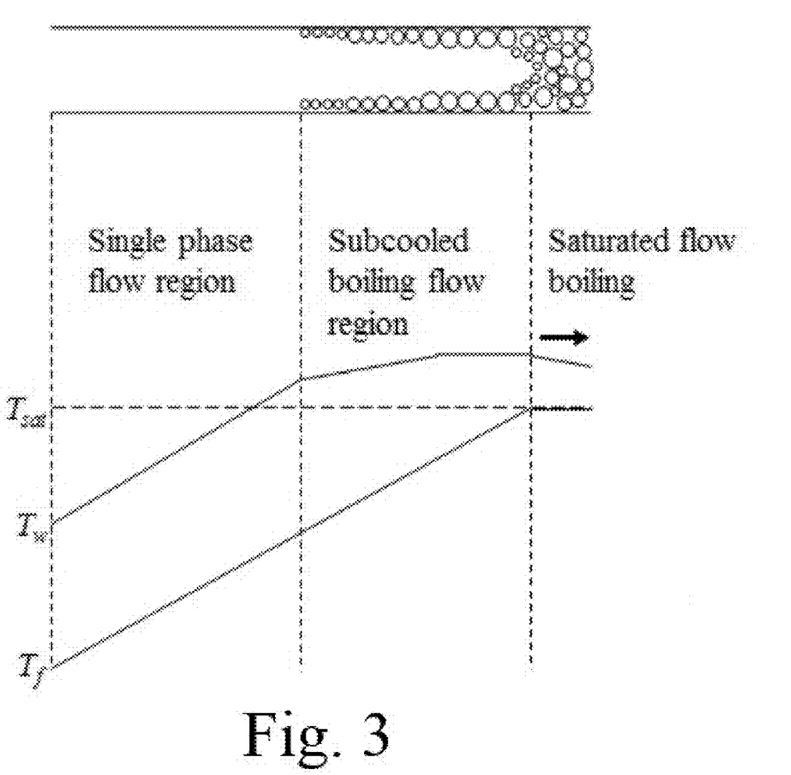
FIG. 3 is a graph depicting temperatures of various regions of coolant fluid, in accordance with features of the present invention.

During subcooled boiling, the coolant bulk temperature is lower than the fluid saturation temperature and the wall temperature is higher than the fluid saturation temperature. This is depicted in FIG. 3, wherein the temperature of the bulk coolant, $T_f$, is below the fluid saturation temperature (boiling temperature), $T_{sat}$, in both the single-phase and subcooled boiling regions. Also shown in FIG. 3 is the wall temperature, $T_w$, which exceeds the fluid saturation temperature at the end of the single-phase region. Then, subcooled boiling commences when the wall temperature is sufficiently above the saturation temperature as shown in FIG. 3. The sketch of FIG. 3 is a representation of conditions that occur in a typical channel heated all around. In the cooling channels of power electronics packages, heat is transferred to the coolant from one side, i.e. from the top in a conventional package with single-sided cooling, or from the bottom of the channels in the top cooling plate in a double-sided cooling configuration. Although the vapor/ liquid patterns differ among these three heating paths, the explanation of the temperatures given above for FIG. 3 is applicable to all cases.

Vapor bubbles generate on the hot wall surfaces but collapse in the relatively cold fluid. Heat is transferred from the surface to the coolant in the form of vapor bubbles. As the bubbles move into the center of the channel, they collapse in the cool fluid, and they transfer the heat from the wall to the fluid. So, the fluid increases in temperature as it flows through the channels (from left to right in FIG. 3) just as would a single-phase liquid.

In a preferred system operation, no net vapor is generated from the circulating coolant, and the fluid remains a single phase at the exit point of the cooling channel. Under these conditions, subcooled boiling exists in the power electronics. (There may be some single-phase liquid heat transfer at the entrance to the power electronics even when subcooled boiling exists over the remainder (majority) of the surface.) The coolant enters the power electronics from the left in FIG. 3 as subcooled single-phase liquid. It may exit as subcooled liquid (with or without subcooled boiling having occurred), or as saturated coolant with or without vapor depending if bulk boiling occurred. The system may be designed not to reach bulk boiling, but single-phase heat transfer and subcooled boiling will occur in different amounts depending on the heat output from the power electronics.

For low vapor quality saturation boiling, the coolant bulk temperature is at the fluid saturation temperature, and the wall temperature is higher than the fluid saturation temperature. As such, vapor bubbles generate on the hot wall surfaces and enter the mixer 36 with the coolant flow. However, since the coolant flow rate for cooling the power electronics is generally lower than that for cooling the engine, and the engine coolant temperature is below the fluid saturation temperature, the vapor generated from saturation boiling condenses in the mixer, resulting in a combined flow which is a single-phase fluid.

During either subcooled boiling or low vapor quality saturation boiling, the coolant fluid remains substantially a liquid throughout the cooling and heating cycle. In subcooled boiling, the only vapor occurs in the power electronics channels (e.g. in close spatial relation to the heat sink surface of the power electronics); the remainder of all fluid passages, conduits, mixers, componentry and other structures are completely filled with liquid.

In saturated boiling (also called bulk boiling), in addition to vapor contacting the heat sink surfaces, there is also vapor in the conduit between the power electronics and the mixer (36 in FIG. 2); simultaneously though, the coolant exists substantially only as a liquid everywhere else in the system. The percent of coolant by mass that is vapor is called the "quality." For subcooled boiling, the coolant exits the power electronics subcooled so the quality is zero. For saturated boiling, the coolant exits with a low quality. The exact value varies with the flows, but it is low enough so that when it mixes with the engine coolant, in the mixer, the mixture is all liquid. There is no general limit on the quality.

EXAMPLE

As noted supra, an embodiment of the invented system and method utilizes typical anti-freeze, anti-boil fluids found in internal combustion engine paradigms. The main engine cooling system works at about 2 atm absolute or 1 atm gauge (approximately 15 psig) of pressure. A corresponding saturation temperature for the 50/50 ethylene glycol/water mixture is about 129° C. Simulations show that there is enough of a subcooled range for keeping the juncture temperature of power electronics within the preferred aforementioned 150-175° C. window.

Simulations by the inventors revealed the conditions under which the coolant exits the power electronic channels and is still be below the saturation point. Exemplary conditions include the following:

Because the subcooled boiling system is integrated into the main engine cooling system, the conventional engine coolant, a 50/50 EG/W mixture, is used for power electronics cooling.

The pressure in the cooling channel for power electronics in hybrid electric vehicles (HEV) is 2 atm where the saturation point of a 50/50 EG/W mixture is 129° C.

In order to eliminate the low-temperature radiator and the associated pumping system, the coolant inlet temperature is assumed to be 105° C.

The coolant flow velocity is 0.16 m/s in order to keep the coolant outlet temperature below the saturation point and to generate desired subcooled boiling. Liquid flow in the cooling channels is laminar at this flow velocity.

The coolant outlet temperature is below the saturation point. Therefore, there is no net vapor in the rest of the system (outside the power electronics cooling channels).

To have desired subcooled boiling, the cooling channel wall temperature is 10-30° C. above the saturation point, i.e. a wall superheat of 10-30° C.

Under such conditions, subcooled boiling would exist throughout the power electronics.

Software Option

Detail

The single radiator relied upon in the invented system is a heat rejecting device and operates under similar conditions to a typical radiator which cools only an internal combustion engine. In an embodiment of the invention, software (e.g., COMSOL Multiphysics Modeling Software, by AltaSim Technologies, Columbus, Ohio, USA) is utilized to determine flow of coolant that is needed to maintain the power electronics at or below 175° C. (Alternatively, coolant flow can be determined empirically.)

The software is applied to numerical simulations using computational fluid dynamics (CFD) and heat transfer modules. Analysis of heat transfer was taken along line 4-4 of FIG. 1, i.e., through a vertical plane including the center of both semiconductors 12. Inasmuch as the hottest spot under the semiconductors is in its center, the selected software paradigm represents the worst situation of heat dissipation in the power electronics package. This ensures that the conditions running simulations maintained the electronics at or below 175° C. even in most conservative (i.e. the hottest or worst case) situations.

Figure 4:
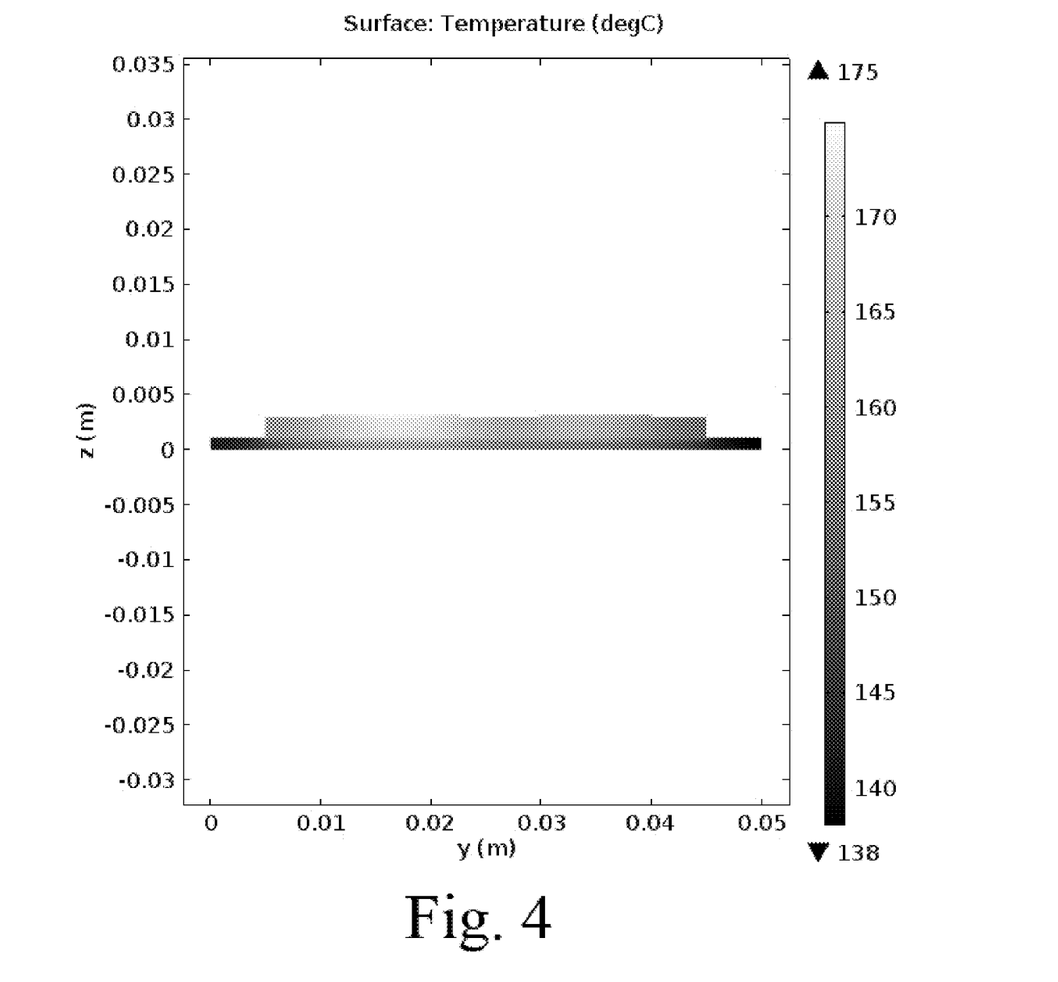
FIG. 4 is a graph of temperatures in various regions of exemplary power electronics treated with subcooled boiling systems, in accordance with features of the present invention.

Typical results from the software simulations are shown in FIG. 4. The temperatures are shown as different shades of gray from white (175° C.) to black (138° C.). FIG. 4 is a view of FIG. 1 taken along line 4-4 for double-sided subcooled boiling heat transfer without fins in channels typical in size for automotive power electronics cooling passages. Parameters varied in the simulations include the TIM thermal resistance, the power density of the power electronics, and the type of cooling, subcooled boiling (e.g. non-laminar) or laminar flow. As noted supra, conventional laminar flow single-sided cooling cannot adequately cool the power electronics at 100 W/cm$^2$ with a single high temperature (105° C.) radiator. In this conventional situation, a separate radiator (75° C.) is required to maintain the semiconductor junction temperature below 175° C.

FIG. 4 depicts results for a current power density of 100 W/cm² without fins and with double-sided cooling. The right side of the graph shows the temperature of substantially the entire electronics construct being maintained at between about 135° C. and about 175° C., without the need for integrally molded cooling fins. This preferred temperature range is the result of subcooled boiling in the cooling passages. When higher power density power electronics are made available, doubled sided cooling with subcooled boiling will increase (typically from at least about 25 percent to 100 percent) the heat removal rate. The invention increases heat removal rate up to 150 percent. For example, doubled sided cooling with subcooled boiling and fins will increase the heat removal rate to 250 W/cm² while maintaining the electronics at or below 175° C. It is noteworthy that the system depicted in FIG. 4 utilized a single passage cooling system, which is to say a smooth, uninterrupted cooling plate devoid of fins or other types of multiple cooling channel configurations. This reduces both manufacturing costs and pumping power costs.

In instances where heat transfer coefficients are utilized, such coefficients are determined by the Shah 1977 correlation, as was publically disclosed in ASHRAE Transcripts, 83(1) 1977, the entirety of which is incorporated by reference. (ASHRAE was formerly known as the American Society of Heating, Refrigerating and Air Conditioning Engineers.) The derived coefficient is then used by the software to determine flow rate.

Figure 5:
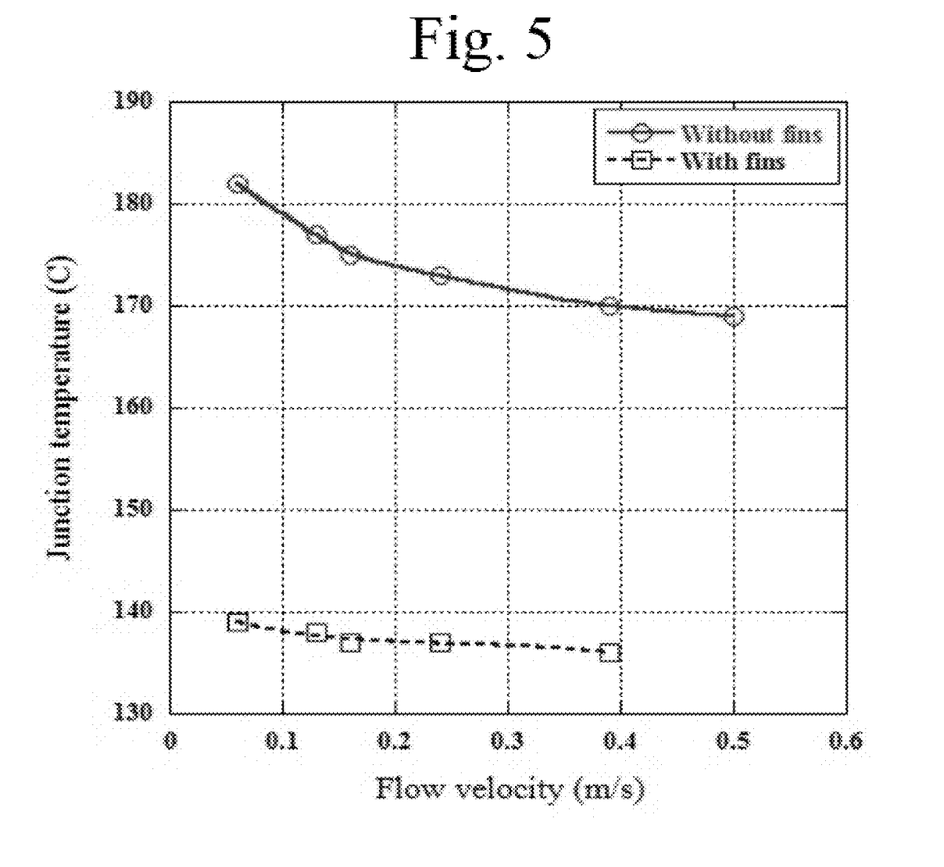
FIG. 5 is a graph comparing coolant flow velocity to electronics junction temperature, in accordance with features of the present invention.

FIG. 5 is a plot of the junction temperature versus the coolant flow velocity. It is for a double-sided cooling system with a 7.5-W/m K TIM thermal conductivity for a 100-W/cm² heat flux on the insulated-gate bipolar transistor (IGBT) and diode surfaces. The coolant flow inlet temperature is 105° C. It is seen that the finned channels combined with subcooled boiling can reduce the junction temperature below 140° C. for all coolant velocities. Without fins, the junction temperature can be controlled below 175° C. when the coolant flow velocity is 0.16 m/s or higher. FIG. 5 shows that the coolant flow velocity does not have significant effect on the junction temperature for the subcooled boiling system.

Efficient cooling using subcooled boiling occurs at low coolant flow velocities, which reduces pressure drops and pumping power requirements. Using fins in the cooling channels, the coolant flow velocity range for subcooled boiling is between 0.06 m/s to 0.4 m/s (the range of FIG. 5). When the velocity is lower than the lower limit of this range, the coolant outlet temperature would be likely above the saturation point. When the velocity is higher than the higher limit of this range, the cooling channel wall temperature cannot reach 10° C. above the saturation point and therefore subcooled boiling is unlikely to occur. The subcooled boiling pressure drop along the cooling channel is relatively small (below approximately 1500 Pa, and preferably approximately 1440-1450 Pa), which would result in low pumping power requirements. Often, approximately zero pressure drop is present.

Figure 6:
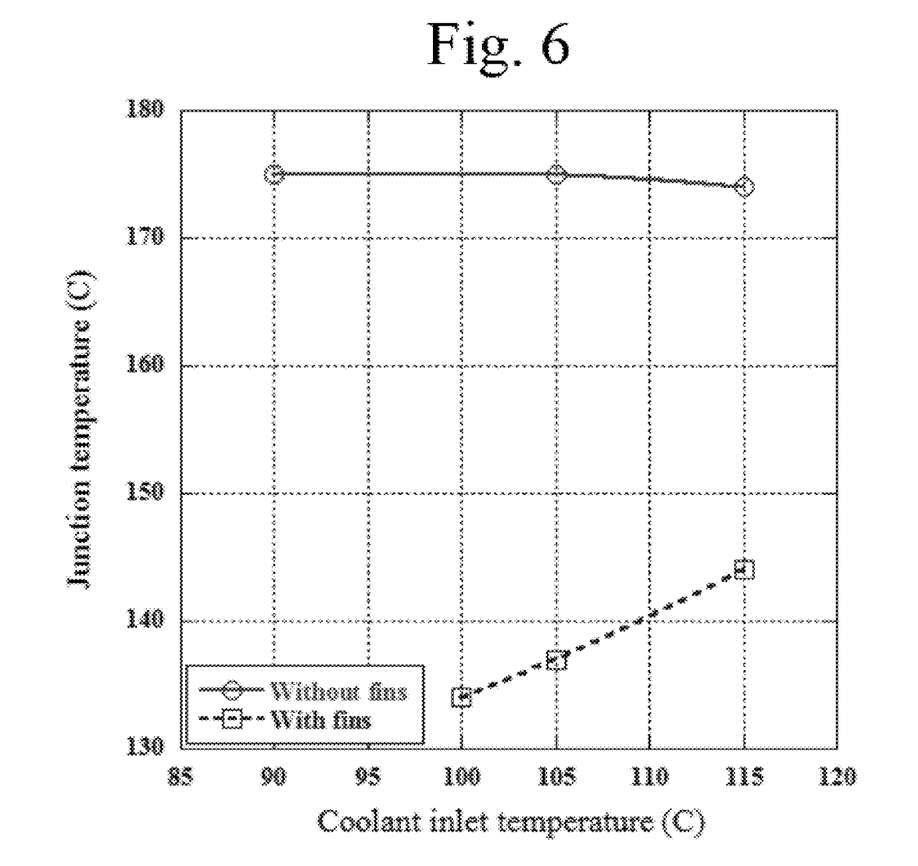
FIG. 6 is a graph comparing coolant inlet temperature to electronics junction temperature, in accordance with features of the present invention.

FIG. 6 illustrates coolant inlet temperature effects on subcooled boiling. A double-sided cooling system with a 7.5-W/m K TIM thermal conductivity for a 100-W/cm² heat flux on the IGBT and diode surfaces was also considered in this test. FIG. 6 shows that the junction temperature can be controlled below 175° C. without fins in the cooling channel and below 150° C. with fins when using subcooled boiling.

The trends in FIG. 6 are different with and without fins. Without fins, the subcooled boiling dominates the cooling process. High coolant inlet temperatures cause strong subcooled boiling due to high subcooled boiling heat transfer coefficients. Therefore, a higher coolant temperature results in a lower junction temperature. (This seemingly counterintuitive phenomenon is due to the resistance to heat transfer during boiling being so low, such that differences in fluid temperature and fluid velocity are secondary effects on the heat transfer rate.) With fins in the cooling channel, convective heat transfer is also important. Consequently, a higher coolant temperature results in a higher junction temperature.

Preferably, in order to maintain subcooled boiling in the cooling channels, the coolant flow inlet temperature should not be below 100° C. with fins while the coolant inlet temperature should not be below 90° C. without fins because lower coolant inlet temperatures cause the channel wall temperature to be below the subcooled boiling range. Furthermore, according to the simulation results displayed in FIG. 6, the coolant inlet temperature does not have significant effects on the junction temperature, especially for the non-finned cooling channel.

FIG. 7 is a graph depicting junction temperature as a function of heat flux, in accordance with features of the present invention. The coolant utilized for this graph was a 50/50 ethylene glycol/water mixture. The coolant inlet temperature was about 105 C (which is the temperature of typical radiator fluid in an internal combustion engine system. Flow rate was 0.16 m/s. The vertical dashed line is the separation point between single phase flow and subcooled boiling flow. These data pertain to a finned system.

Figure 8:
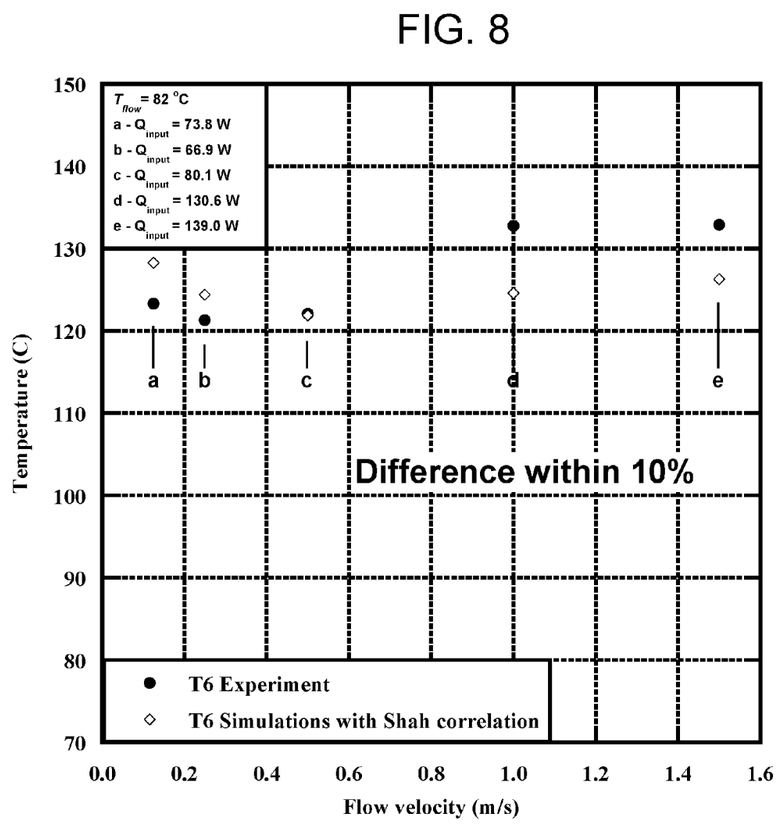
FIG. 8 is a graph comparing measured temperatures with mathematically predicted temperatures in a subcooled boiling, in accordance with features of the present invention.

FIG. 8 is a graphical comparison between experimentally measured temperatures and temperatures calculated using the aforementioned Shah correlation, as discussed supra. The good temperature comparison supports the use of the Shah correlation in the computer simulations performed in the development of this invention.

In FIG. 8, values a-e are heat input values ranging from between approximately 70 W and 140 W. In one embodiment of the invention, with a $T_f$ of approximately 82° C., a=74 W, b=67 W, c=80 W, d=130-131 W and e=139 W.

In summary, the invented system enhances the cooling capacity for power electronics using two-phase subcooled boiling in the cooling channels while the coolant outlet temperature is still below the saturation point. Thus, there is no vapor in the rest of the system.

It is to be understood that the above description is intended to be illustrative, and not restrictive. The above-described embodiments (and/or aspects thereof) may be used in combination with each other. In addition, many modifications may be made to adapt a particular situation or material to the teachings of the invention without departing from its scope.

While the dimensions and types of materials described herein are intended to define the parameters of the invention, they are by no means limiting, but are instead exemplary embodiments. Many other embodiments will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the terms "comprising" and "wherein." Moreover, in the following claims, the terms "first," "second," and "third," are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

As will be understood by one skilled in the art, for any and all purposes, particularly in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," "more than" and the like include the number recited and refer to ranges which can be subsequently broken down into subranges as discussed above. In the same manner, all ratios disclosed herein also include all subratios falling within the broader ratio.

One skilled in the art will also readily recognize that where members are grouped together in a common manner, such as in a Markush group, the present invention encompasses not only the entire group listed as a whole, but each member of the group individually and all possible subgroups of the main group. Accordingly, for all purposes, the present invention encompasses not only the main group, but also the main group absent one or more of the group members. The present invention also envisages the explicit exclusion of one or more of any of the group members in the claimed invention.

The invention claimed is:

1. A single radiator method for simultaneously cooling electronics and an internal combustion engine in hybrid electric vehicles, the method comprising:
   a) separating a coolant fluid into a first portion and a second portion;
   b) directing the first portion to the electronics and the second portion to the internal combustion engine for a time sufficient to maintain the temperature of the electronics at or below 175° C.;
   c) combining the first and second portion to reestablish the coolant fluid; and
   d) treating the reestablished coolant fluid to the single radiator for a time sufficient to decrease the temperature of the reestablished coolant fluid to approximately the same temperature it was at when first separated into a first portion and a second portion, wherein the fluid is a subcooled boiling fluid.

2. The method as recited in claim 1 wherein the fluid is a liquid selected from the group consisting of ethylene glycol, propylene glycol, water, polyalphaolefin, and combinations thereof.

3. A single radiator method for simultaneously cooling electronics and an internal combustion engine in hybrid electric vehicles, the method comprising:
   a) separating a coolant fluid into a first portion and a second portion;
   b) directing the first portion to the electronics and the second portion to the internal combustion engine for a time sufficient to maintain the temperature of the electronics at or below 175° C.;
   c) combining the first and second portion to reestablish the coolant fluid; and
   d) treating the reestablished coolant fluid to the single radiator for a time sufficient to decrease the temperature of the reestablished coolant fluid to approximately the same temperature it was at when first separated into a first portion and a second portion, wherein the electronics are maintained at a current power density of between approximately 100 W/cm$^2$ and approximately 250 W/cm$^2$.

4. The method as recited in claim 1 wherein the step of directing the first portion to the electronics comprises flowing the first portion through a single fluid passage defining a heat exchange surface of the electronics.

5. The method as recited in claim 3 wherein the electronics are in thermal communication with a plurality of heat exchange surfaces and the first portion simultaneously contacts said plurality of surfaces.

6. The method as recited in claim 3 wherein the fluid is a liquid selected from the group consisting of ethylene glycol, propylene glycol, water, polyalphaolefin, and combinations thereof.

7. The method as recited in claim 3 wherein the coolant fluid is maintained at a pressure of between approximately 0 psig and approximately 45 psig.

8. The method as recited in claim 3 wherein the coolant fluid remains in liquid phase when not in contact with heat sinks defining surfaces of the electronics.

9. The method as recited in claim 1 wherein the coolant fluid is maintained at a pressure of between approximately 0 psig and approximately 45 psig.

10. The method as recited in claim 1 wherein coolant fluid remains in liquid phase when not in contact with heat sinks defining surfaces of the electronics.

* * * * *